(12) United States Patent
Chen

(10) Patent No.: US 7,436,690 B2
(45) Date of Patent: Oct. 14, 2008

(54) FLAT CELL READ ONLY MEMORY USING COMMON CONTACTS FOR BIT LINES AND VIRTUAL GROUND LINES

(75) Inventor: Hsu-Shun Chen, Toufen Township, Miaoli County (TW)

(73) Assignee: Elan Microelectronics Corporation, Hsinchu (TW)

( * ) Notice: Subject to any disclaimer, the term of this patent is extended or adjusted under 35 U.S.C. 154(b) by 0 days.

(21) Appl. No.: 11/168,515

(22) Filed: Jun. 29, 2005

(65) Prior Publication Data
US 2006/0176754 A1 Aug. 10, 2006

(30) Foreign Application Priority Data
Jul. 2, 2004 (TW) .............................. 93120062 A

(51) Int. Cl.
*G11C 17/00* (2006.01)

(52) U.S. Cl. ..................... 365/104; 365/72; 365/185.16; 365/214

(58) Field of Classification Search ................... 365/94, 365/185.11, 185.16, 230.03, 72, 103, 104, 365/214
See application file for complete search history.

(56) References Cited

U.S. PATENT DOCUMENTS

| | | | | |
|---|---|---|---|---|
| 5,241,497 A * | 8/1993 | Komarek | ............... | 365/185.16 |
| 5,392,233 A * | 2/1995 | Iwase | ......................... | 365/104 |
| 5,517,448 A * | 5/1996 | Liu | ....................... | 365/185.11 |
| 6,081,474 A * | 6/2000 | Togami et al. | ......... | 365/230.03 |
| 6,157,580 A * | 12/2000 | Kohno | .................... | 365/189.09 |
| 6,380,636 B1 * | 4/2002 | Tatsukawa et al. | ..... | 257/390 |
| 6,477,083 B1 * | 11/2002 | Fastow et al. | ......... | 365/185.16 |
| 6,577,536 B1 * | 6/2003 | Chung et al. | ........... | 365/185.11 |
| 6,850,438 B2 * | 2/2005 | Lee et al. | ............... | 365/185.11 |
| 6,906,951 B2 * | 6/2005 | Wong | .................... | 365/185.11 |
| 7,154,765 B1 * | 12/2006 | Chen | ........................... | 365/94 |

* cited by examiner

*Primary Examiner*—VanThu Nguyen
*Assistant Examiner*—Alexander Sofocleous
(74) *Attorney, Agent, or Firm*—Rosenberg, Klein & Lee

(57) ABSTRACT

In a flat cell read only memory, two bit lines or two virtual ground lines share a common contact such that the contact is slightly adjustable in its location for inserting a local metal word line without increasing the layout area to improve the reading speed of the memory. Moreover, two adjacent banks of the memory share common bit lines or virtual ground lines, whereby reducing the contact density and height of the memory.

7 Claims, 9 Drawing Sheets

FLAT CELL READ ONLY MEMORY USING COMMON CONTACTS FOR BIT LINES AND VIRTUAL GROUND LINES

FIELD OF THE INVENTION

The present invention is related generally to a read only memory (ROM) and more particularly to a flat cell ROM structure for high-speed applications.

BACKGROUND OF THE INVENTION

Speeding up is always one of the attempts in the ROM design. For a high-speed memory, the main bottleneck in design is the low speed on the word line owing to the large resistance and parasitic capacitance inherent in a polysilicon word line, and there have been proposed two solutions for improving thereto. The first one is to separate a word line into several segments along the length thereof, and provide for each segment of the word line with an individual word line driver, so as to have a higher operating speed of the memory. In other words, the memory is separated into several small ones in this solution. For more illustrative, FIG. 1 is a schematic diagram of this solution, in which FIG. 1A is a simplified diagram of showing several word lines 10 and word line drivers 12 for driving the word lines 10 in a memory before the word line 10 is separated into multiple segments, and FIG. 1B is a simplified diagram of showing each of the word lines 10 in FIG. 1A having been separated into two segments 102 and 104. In FIG. 1A, each word line 10 has a length of L, and each word line 10 is driven by a word line driver 12. After separated into two segments 102 and 104 along the length L, each word line 10 is provided with two drivers 12 for the segments 102 and 104, respectively. For each segment 102 or 104 of a word line 10, the resistance and parasitic capacitance thereof are only half as large as that of the original one, and therefore the operating speed thereto is improved. However, this solution requires a large number of additional word line drivers 12, thereby dramatically increasing the circuit area of the memory.

The other solution for speeding up a memory is to connect a word line with a metal line in parallel along the direction of the word line to reduce the RC delay thereof, and this metal line is referred to as a word line strap. The word line strap technique will not requests much more additional layout area, but is only available for those processes of two or more metal layers, due to the requirement of looser contacts in an array for the contacts to be slightly shifted in their locations so as to insert local metal word lines in the direction along the bit lines of the memory to connect the respective word lines in each memory banks. For more illustrative to the use of the word line strap, FIG. 2 shows a schematic diagram of a simplified memory 20, in which each of two memory banks Bank0 and Bank1 includes a word line WL0, and each of the word lines WL0 is connected with a word line strap 204 or 206 in parallel by its side to reduce the resistance thereof. In the memory 20, the bit lines BL0 and BL1, virtual ground lines VG0 and VG1, and local word line LWL0 are formed from a first metal layer and perpendicular to the word lines WL0 in the banks Bank0 and Bank1, and the word line straps 204 and 206, and global word line GWL0 are formed from a second metal layer, in which the local word line LWL0 connects the word line straps 204 and 206 to the global word line GWL0 through contacts 208, 210, and 212, respectively, and the dash line 202 indicates the word line signal path.

FIG. 3 provides a circuit diagram of a conventional flat cell ROM to show why the word line strap technique is not available for flat cell ROMs. In a memory 30, a memory array 32 includes several transistors 322 serving as memory cells arranged in a manner that the gates of the transistors 322 on the same row are connected to a common word line among WL0-WLN, and the sources/drains of the transistors 322 on the same column are connected to a common bit line BL or virtual ground line VG, and select lines SL0 and SL1 to select the bit line BL and virtual ground line VG. FIG. 4 shows a layout of the circuit 30 shown in FIG. 3, in which Bank0, Bank1, and Bank2 represent different memory banks. In the memory bank Bank1, each bit line BL and each virtual ground line VG are connected to a respective bit signal line 36 and a respective virtual ground signal line 38 through a respective contact 34. It is shown in FIG. 4 that there is no enough space between the adjacent contacts 34 allowed the contacts 34 to be slightly shifted in their locations and therefore, inserting any local word line between the bit signal line 36 and virtual ground signal line 38 will push the adjacent structures away from the original locations in the X-direction and enlarge the layout area.

Therefore, it is desired a flat cell ROM available for the word line strap technique to be applied without an enlarged layout area.

SUMMARY OF THE INVENTION

One object of the present invention is to provide a flat cell ROM structure available for the word line strap technique to be applied thereto.

Another object of the present invention is to provide a flat cell ROM using common contacts for bit lines and virtual ground lines.

In a flat cell read only memory including a plurality of memory banks, according to the present invention, each of the memory banks comprises a memory array, and a plurality of word lines as well as a plurality of bit lines and virtual ground lines perpendicular thereto connected to the memory array for selecting a specific memory cell therefrom, in which any two adjacent bit lines are connected to the memory array through a first switch and a second switch, respectively, and connected to a bit signal line through a first common contact, each of the virtual ground lines is connected to the memory array through a third switch and a fourth switch, any two adjacent virtual ground lines are connected to a virtual ground signal line through a second common contact, and the first and second contacts are shared by adjacent memory banks of the memory. Further, the first and third switches are switched by a first select line, and the second and fourth switches are switched by a second select line.

With the first contact shared by two bits line and the second contact shared by two virtual ground lines, the contacts in a memory of the present invention are allowed to be slightly adjusted in their locations to insert a local word line for speeding up the operation of the memory without increasing the layout area. Moreover, in a memory of the present invention, with the first and second contacts shared by adjacent banks, the contact density is reduced, and the height of the memory is reduced accordingly.

BRIEF DESCRIPTION OF DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 5:
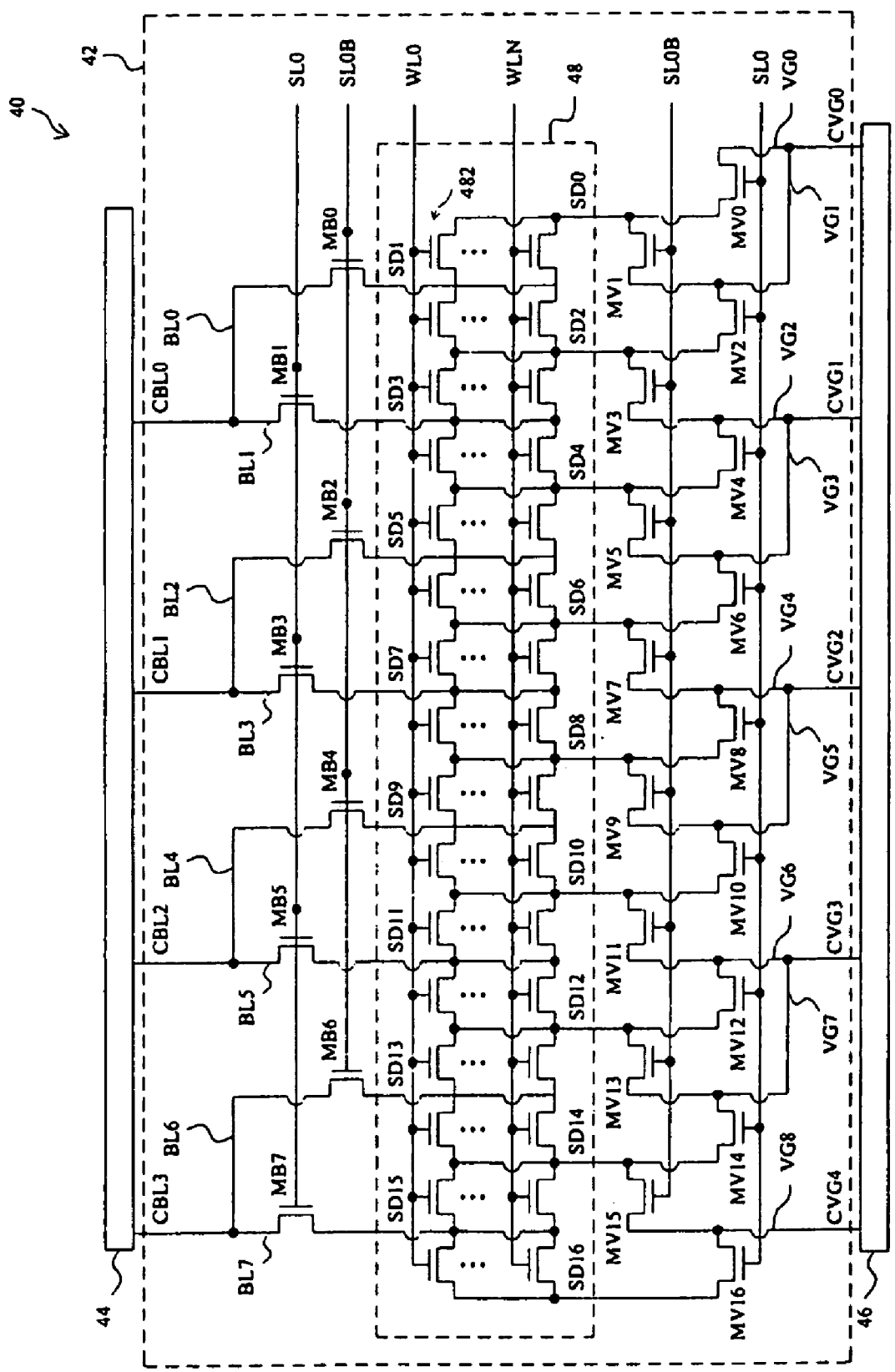
FIG. 5 shows a circuit diagram of a flat cell ROM according to the present invention.

FIG. 5 shows a circuit diagram of a flat cell ROM 40 according to the present invention. In a memory bank 42 of the ROM 40, a memory array includes several transistors 482 serving as memory cells arranged in a manner that the gates of the transistors 482 on the same row are connected to a common word line among WL0-WLN, and the sources/drains of the transistor 482 on the same column are connected to one of bit lines BL0-BL7 or virtual ground lines VG0-VG8, respectively. The bit lines BL0 and BL1 are bonded together to a common bit line CBL0, and capable of being connected to the memory array 48 through transistors MB0 and MB1, respectively. The bit lines BL2 and BL3 are bonded together to a common bit line CBL1, and capable of being connected to the memory array 48 through transistors MB2 and MB3, respectively. The bit lines BL4 and BL5 are bonded together to a common bit line CBL2, and capable of being connected to the memory array 48 through transistors MB4 and MB5, respectively. The bit lines BL6 and BL7 are bonded together to a common bit line CBL3, and capable of being connected to the memory array 48 through transistors MB6 and MB7, respectively. The virtual ground lines VG0 and VG1 are bonded together to a common virtual ground line CVG0, the virtual ground line VG0 is capable of being connected to the memory array 48 through a transistor MV0, and the virtual ground line VG1 is capable of being connected to the memory array 48 through transistors MV1 and MV2. The virtual ground lines VG2 and VG3 are bonded together to a common virtual ground line CVG1, the virtual ground line VG2 is capable of being connected to the memory array 48 through transistors MV3 and MV4, respectively, and the virtual ground line VG1 is capable of being connected to the memory array 48 through transistors MV5 and MV6, respectively. The virtual ground lines VG4 and VG5 are bonded together to a common virtual ground line CVG2, the virtual ground line VG4 is capable of being connected to the memory array 48 through transistors MV7 and MV8, respectively, and the virtual ground line VG5 is capable of being connected to the memory array 48 through transistors MV9 and MV10, respectively. The virtual ground lines VG6 and VG7 are bonded together to a common virtual ground line CVG3, the virtual ground line VG6 is capable of being connected to the memory array 48 through transistors MV11 and MV12, respectively, and the virtual ground line VG7 is capable of being connected to the memory array 48 through transistors MV13 and MV14, respectively. The transistors MB1, MB3, MB5, MB7, MV0, MV2, MV4, MV6, MV8, MV10, MV12, MV14, and MV16 are under the control of a select line SL0, and the transistors MB0, MB2, MB4, MB6, MV1, MV3, MV5, MV7, MV9, MV11, MV13, and MV15 are under the control of a select line SL0B.

Figure 1A:
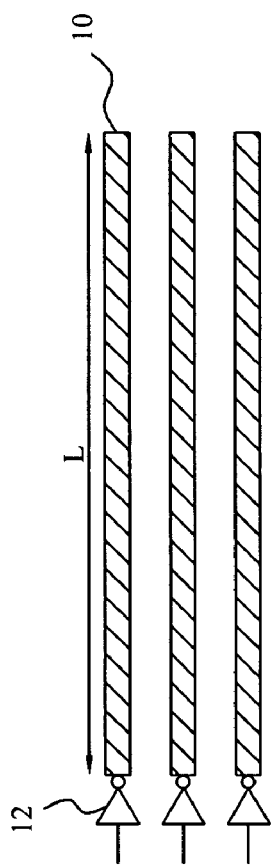
FIG. 1A is a simplified diagram of several word lines and word line drivers in a conventional memory.
Figure 1B:
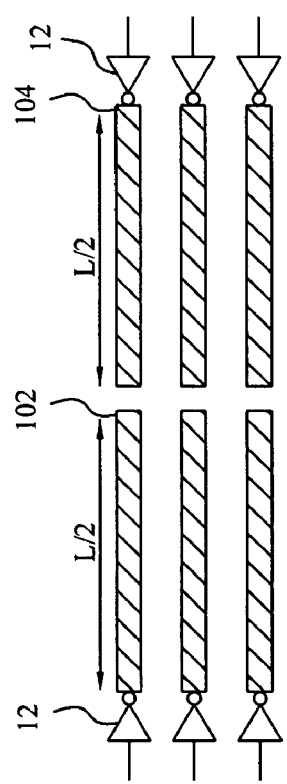
FIG. 1B is a simplified diagram of several word lines having separated segments and word line drivers in a conventional memory.
Figure 2:
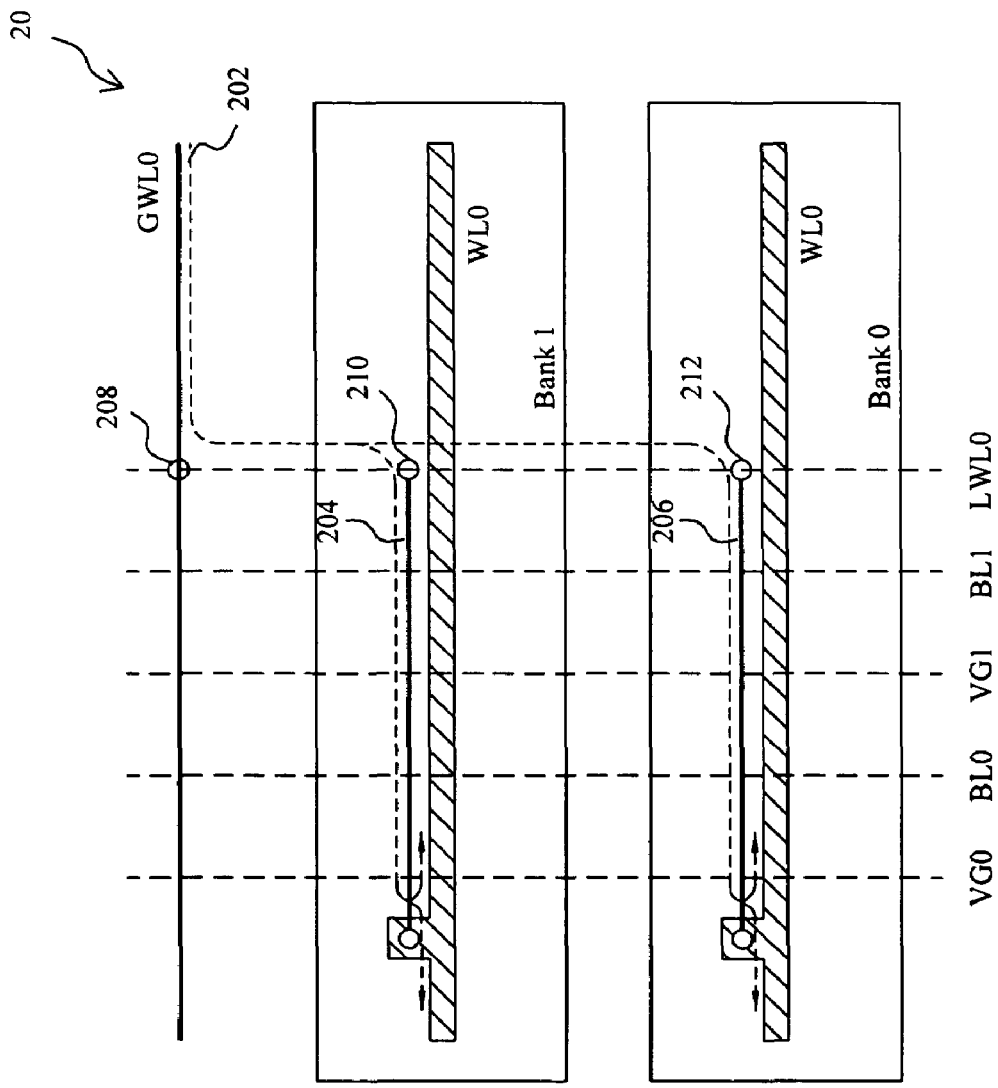
FIG. 2 shows a schematic diagram of a simplified conventional memory using the word line strap technique.
Figure 3:
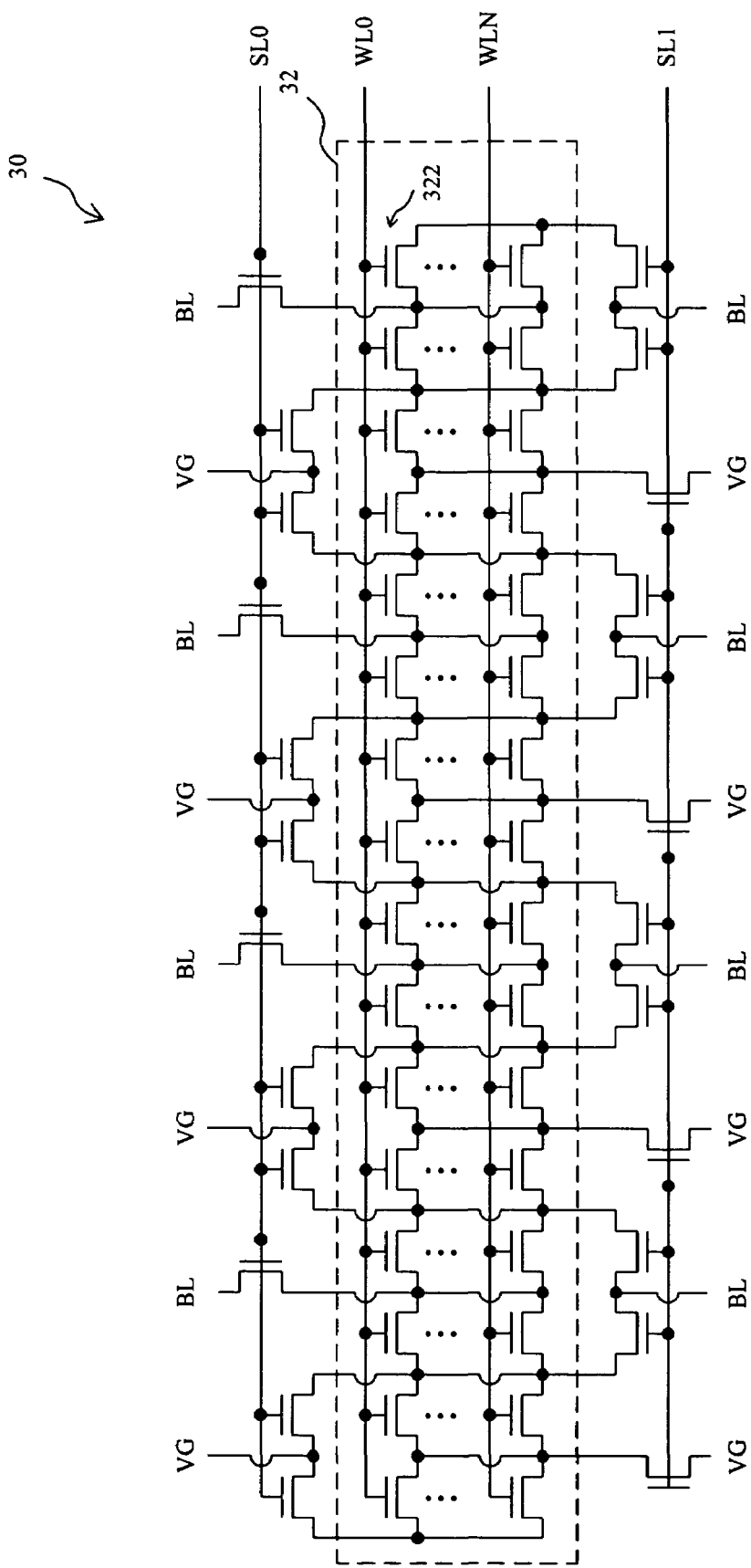
FIG. 3 shows a circuit diagram of a conventional flat cell ROM.
Figure 4:
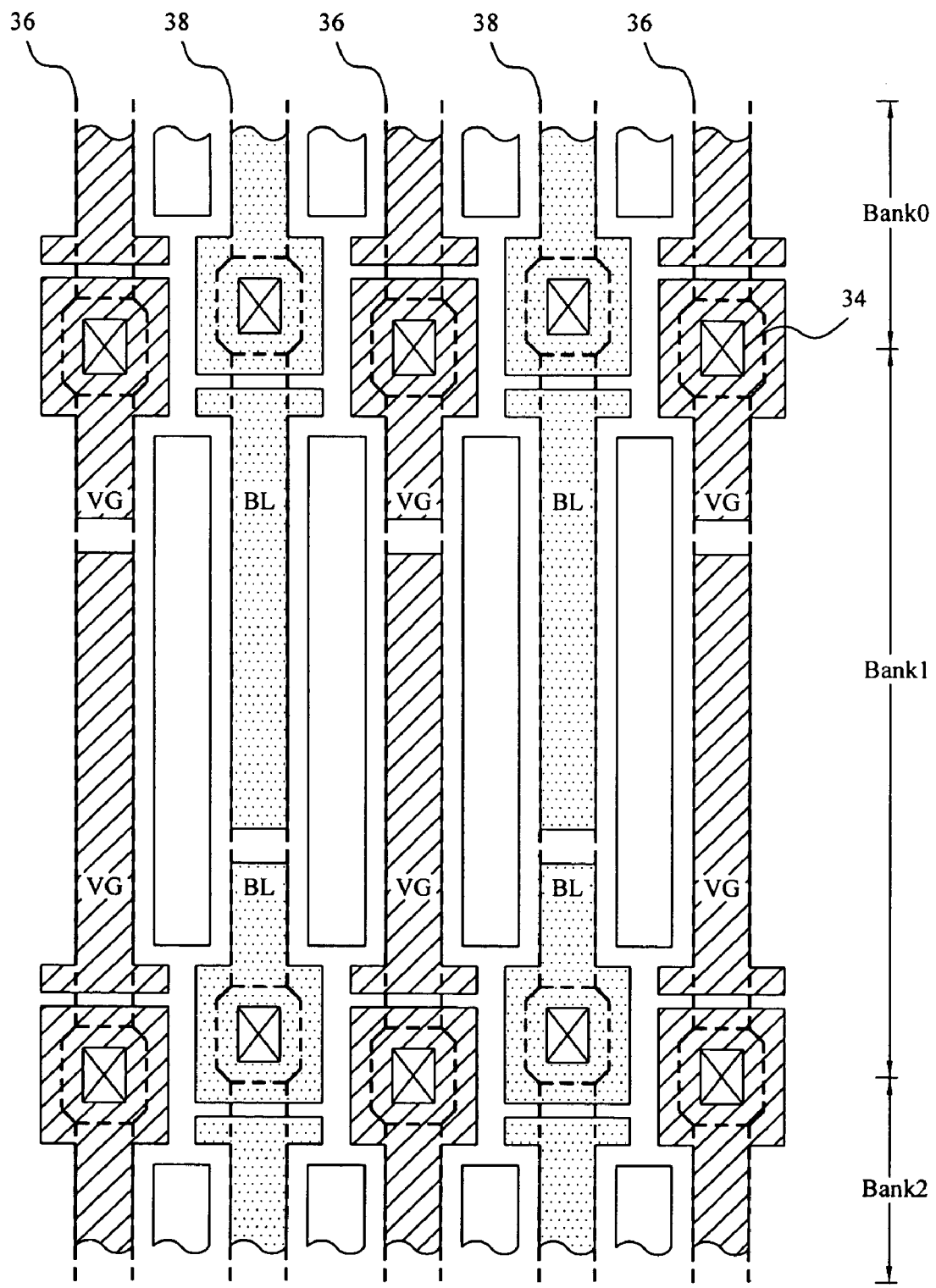
FIG. 4 shows a layout of the memory circuit shown in FIG. 3.

Referring to FIG. 5, in the flat cell ROM 40, memory banks 42 and 44 share the common bit lines CBL0-CBL3, and memory banks 42 and 46 share the common virtual ground lines CVG0-CVG4. In this embodiment, moreover, the bit lines BL0-BL7 and virtual ground lines VG0-VG8 are arranged at the top side and bottom side of the memory array 48, respectively, and therefore the cell current path is an I-type path. While in the conventional ROM 30 shown in FIG. 3, the cell current path is a U-type path, owing to the staggered arrangement of the bit lines BL and virtual ground lines VG. It is known to those skilled ones in the art that, under a same bias, an I-type cell current path has a larger cell current than a U-type cell current path does. As a result, a greater design margin is obtained, and the reading speed is higher.

Figure 6:
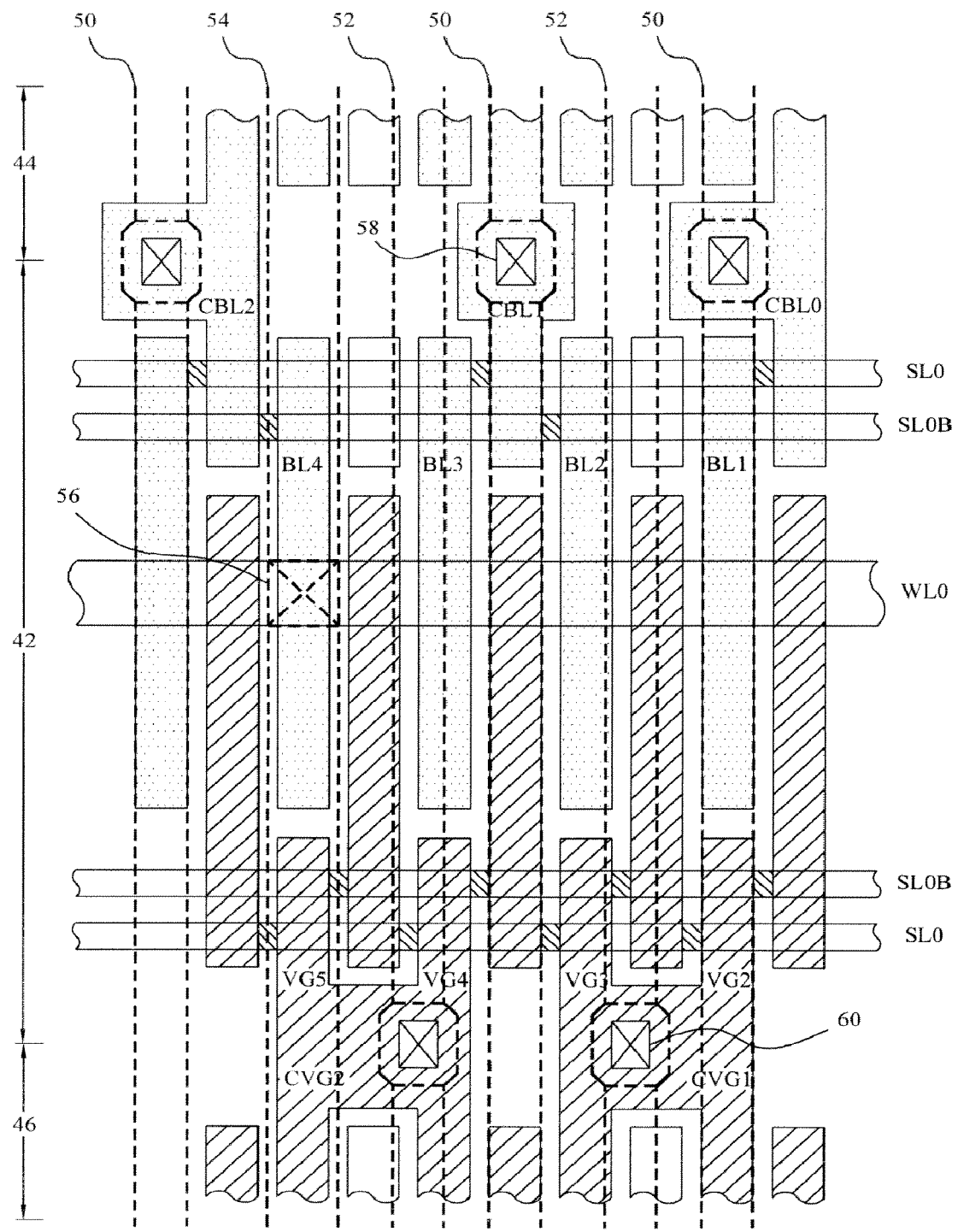
FIG. 6 shows a layout of the memory circuit shown in FIG. 5.

FIG. 6 shows a layout of part of the circuit 40 shown in FIG. 5, from which is pictured that two adjacent bit lines, for example BL2 and BL3, share a common contact 58 to connect to a bit signal line 50, and two adjacent virtual ground lines, for example VG2 and VG3, share a common contact 60 to connect to a virtual ground signal line 52, resulting in less contacts. Therefore, there is a larger space present between two adjacent contacts for the contacts to be adjusted in their locations, so as to easily insert a local word line 54 between a bit signal line 50 and a virtual ground signal line 52 to connect to the word line WL0 through a contact 56. Furthermore, the memory banks 42 and 44 have their bit lines to share the contact 58 therebetween, and the memory banks 42 and 46 have their virtual ground lines to share the contact 60 therebetween, thereby reducing the contact density and the height of the memory.

Figure 7:
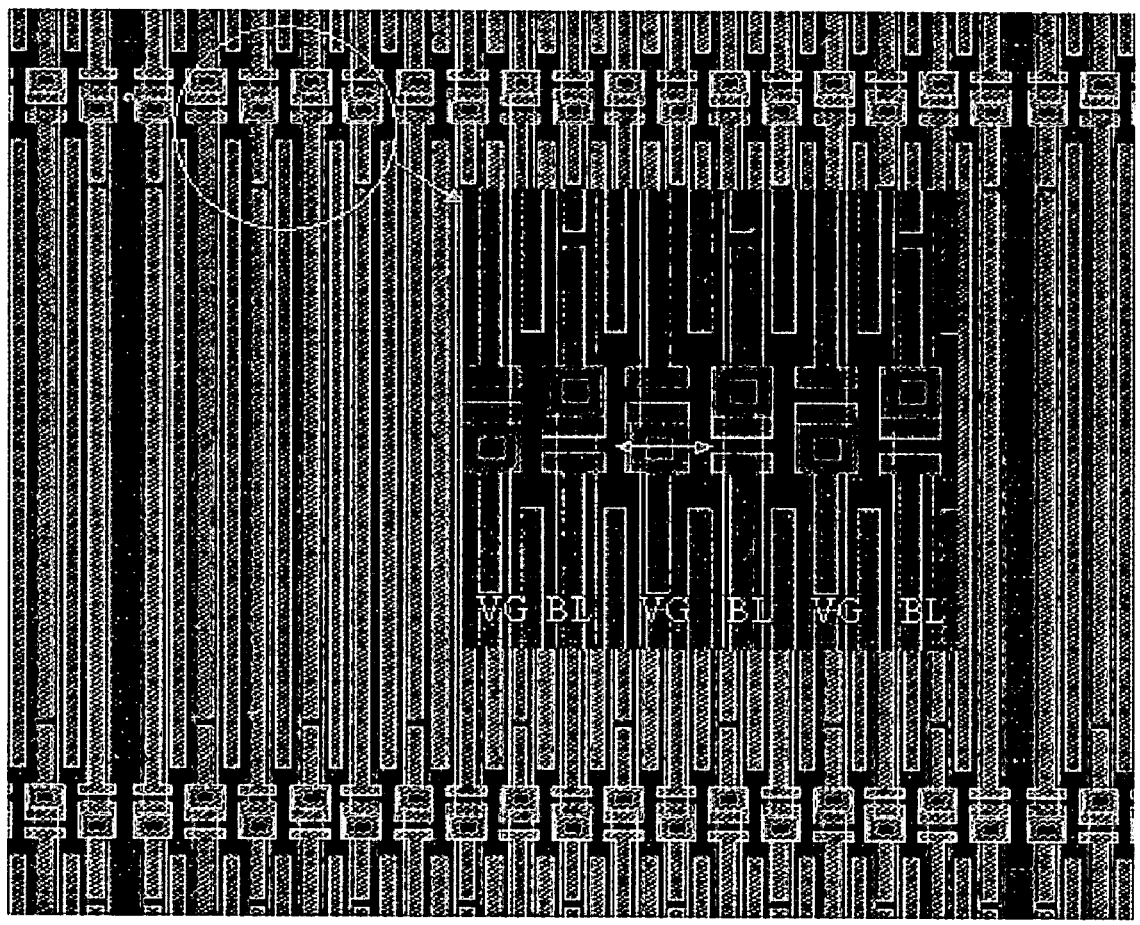
FIG. 7 shows a practical layout of the memory shown in FIG. 3.
Figure 8:
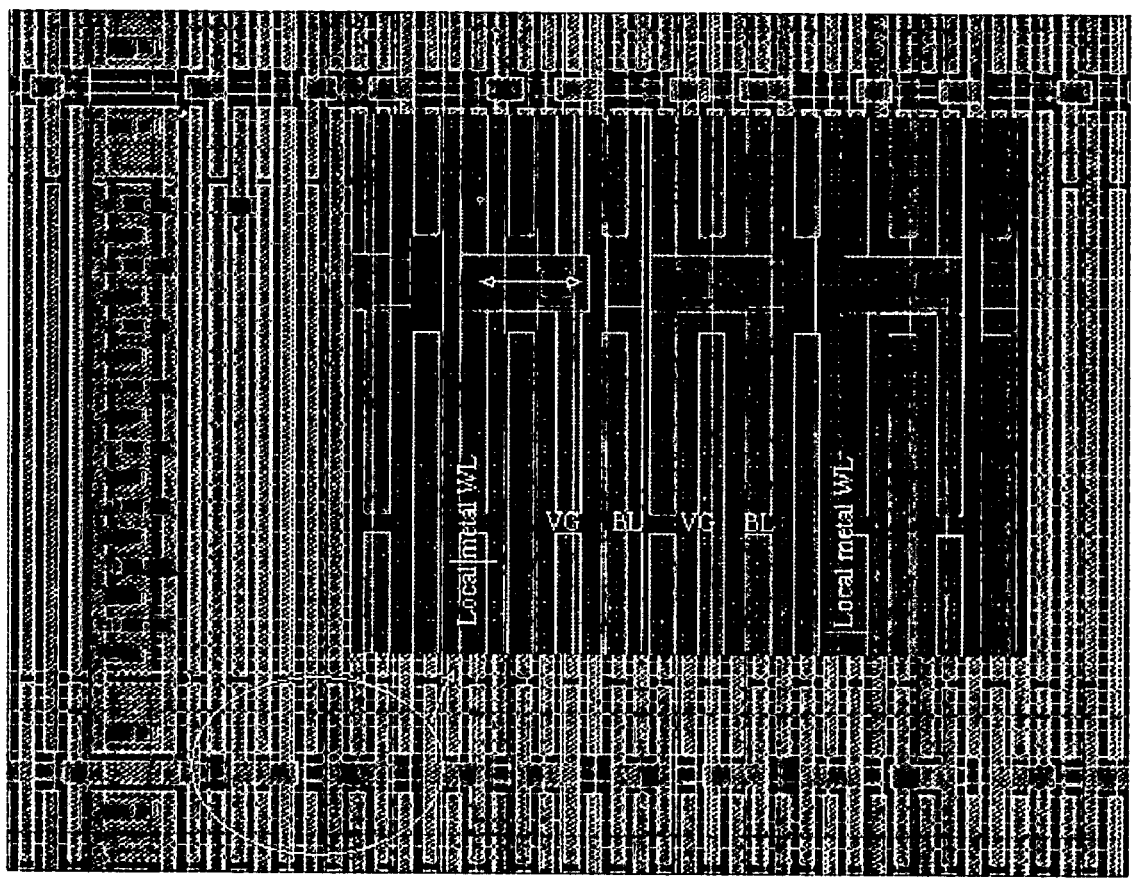
FIG. 8 shows a practical layout of the memory shown in FIG. 5.
Figure 9:
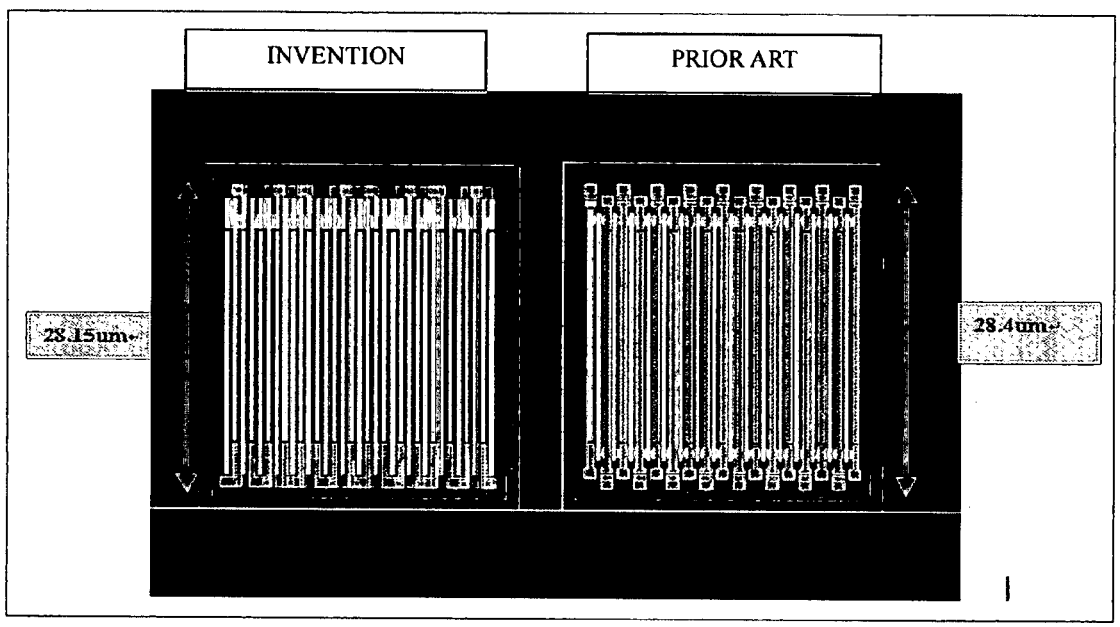
FIG. 9 shows two memory banks of the memories shown in FIGS. 3 and 5, respectively.

FIG. 7 is a practical layout of the conventional memory 30, and FIG. 8 shows a practical layout of the memory 40 according to the present invention, from which it is shown that the contact density between adjacent banks in the memory 40 is much lower than that in the conventional memory 30. For comparison, FIG. 9 shows a layout of one memory bank in the memory 40 according to the present invention and a layout of one memory bank in the conventional memory 30 to put together, with the former on the left and the latter on the right, and the heights of them besides. The memory bank of the present invention has a height of 28.15 µm, which is 0.25 µm or approximately 0.88% less than the height of 28.4 µm for the conventional memory bank.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set fourth in the appended claims.

What is claimed is:

1. In a flat cell read only memory including a plurality of memory banks, each of the memory banks comprising:
   a memory array;
   a plurality of first bit lines each capable of being connected to the memory array through a first switch;
   a plurality of second bit lines each capable of being connected to the memory array through a second switch;

a plurality of first contacts each for connecting one of the plurality of first bit lines and one of the plurality of second bit lines to a bit signal line;

a plurality of virtual ground lines extending outside said memory array, the plurality of virtual ground lines being arranged in pairs of adjacent virtual ground lines, each virtual ground line of said pair of adjacent virtual ground lines being connected to the memory array through a third switch and a fourth switch, each switch being driven separately;

a plurality of second contacts, each second contact connecting a respective one of said pairs of adjacent virtual ground lines to a virtual ground signal line;

a first select line coupled to each of the first and third switches for controlling switching thereof; and a second select line coupled to each of the second and fourth switches for controlling switching thereof.

2. The memory of claim 1, wherein each of the memory banks further comprises a plurality of local word lines arranged between the bit signal lines and virtual ground signal lines.

3. The memory of claim 1, wherein the plurality of first contacts are shared with two adjacent memory banks.

4. The memory of claim 1, wherein the plurality of first contacts are slightly adjustable in their locations.

5. The memory of claim 1, wherein the plurality of second contacts are shared with two adjacent memory banks.

6. The memory of claim 1, wherein the plurality of second contacts are slightly adjustable in their locations.

7. The memory of claim 1, wherein any one of the first or second bit lines and one of the plurality of virtual ground lines are operable to provide an I-type cell current path.

* * * * *